(12) United States Patent
Tanaka

(10) Patent No.: US 7,538,414 B2
(45) Date of Patent: May 26, 2009

(54) SEMICONDUCTOR INTEGRATED CIRCUIT DEVICE

(75) Inventor: Akira Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 7 days.

(21) Appl. No.: 11/755,094

(22) Filed: May 30, 2007

(65) Prior Publication Data
US 2007/0278652 A1 Dec. 6, 2007

(30) Foreign Application Priority Data
May 31, 2006 (JP) .............................. 2006-151439

(51) Int. Cl.
*H01L 23/48* (2006.01)
(52) U.S. Cl. ............... 257/665; 257/690; 257/E23.004; 257/692
(58) Field of Classification Search ................. 257/723, 257/666, E23.09, 665
See application file for complete search history.

(56) References Cited
U.S. PATENT DOCUMENTS
5,991,135 A * 11/1999 Saleh ........................... 361/56

2003/0183924 A1 * 10/2003 Bhalla et al. ................. 257/723
2005/0194671 A1    9/2005 Yoshikawa et al.

FOREIGN PATENT DOCUMENTS
JP     2005-252099    9/2005
JP     2006-147602    6/2006

* cited by examiner

*Primary Examiner*—Sue Purvis
*Assistant Examiner*—William Harriston
(74) *Attorney, Agent, or Firm*—RatnerPrestia

(57) ABSTRACT

Disclosed is a semiconductor IC device capable of suppressing the interference of noise generated in one functional block with other functional blocks therein while protecting against electrostatic breakdown. A plurality of isolated pads are connected to a first terminal through respective wires, and further connected to a plurality of isolated pads each connected to a second terminal having the same function as that of the first terminal, so as to reduce noise interference based on the pad isolation and protect against electrostatic breakdown based on the inter-pad connection.

4 Claims, 8 Drawing Sheets

SEMICONDUCTOR INTEGRATED CIRCUIT DEVICE

RELATED APPLICATION

This application is based on Japanese Patent Application No. 2006-151439, the contents of which are incorporated herein by reference.

BACKGROUND OF THE INVENTION

The present invention relates to a technique for reducing the influence of noise generated in a functional block on other functional blocks in a semiconductor integrated circuit (IC) device, and more particularly to a semiconductor IC device adapted to balance the protection against noise interference with the protection against electrostatic breakdown, i.e., surge.

Figure 8:
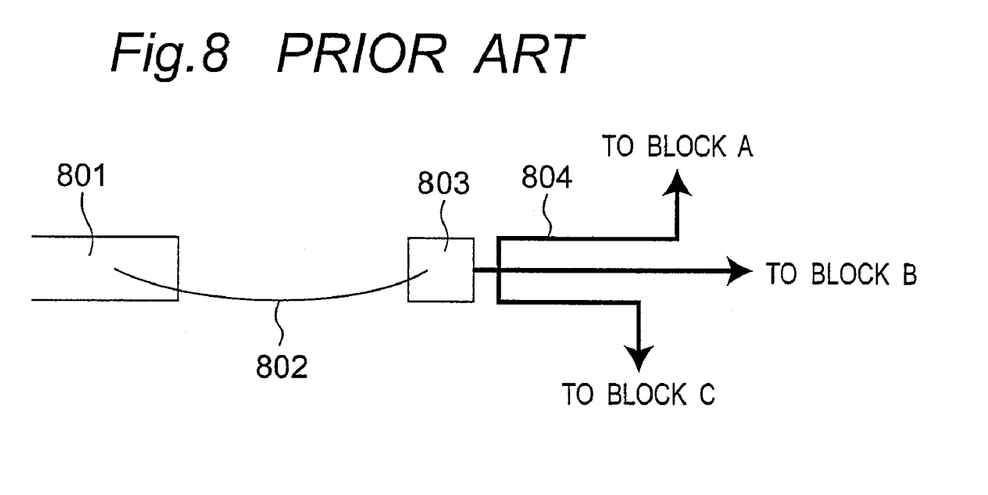
FIG. 8 is an explanatory diagram of one conventional technique of reducing noise interference.

Late years, in semiconductor IC devices, a noise level has become increasingly higher due to increase in operating frequency associated with progress in higher processing speed. Under such a situation, there has been proposed a technique of reducing noise interference between a plurality of functional blocks (each hereinafter referred to simply as "block") based on isolation of a pad. FIG. 8 shows one example of this type of technique. In this semiconductor IC device, a lead frame 801 and a pad 803 are electrically connected to each other through a wire 802. The pad 803 is connected to a plurality of blocks through respective intra-chip wires 804.

Specifically, as shown in FIG. 8, in order to prevent noise occurring in one of three blocks A to C from interfering with other two blocks, the three blocks A to C are connected at a single point in or near the pad 803. In this technique, if the single connection point has a sufficiently low impedance, noise interference can be reduced as expected. In reality, elements, such as the wire 802 and the lead frame 801, in a terminal area between the pad 803 and the outside of a semiconductor package, have a certain level of impedance, and it is difficult to adequately lower the impedance at the single connection point, which is liable to cause the problem of noise interference between the blocks.

There has therefore been proposed another technique of more effectively preventing noise interference, as disclosed in R. Jacob Baker, Harry W. Li, and David E. Boyce, "CMOS Circuit Design, Layout, and Simulation", ISBN 0-7803-3416-7 (referred to as "Publication 1" hereinafter). This technique will be described below with reference to FIG. 9.

Figure 9:
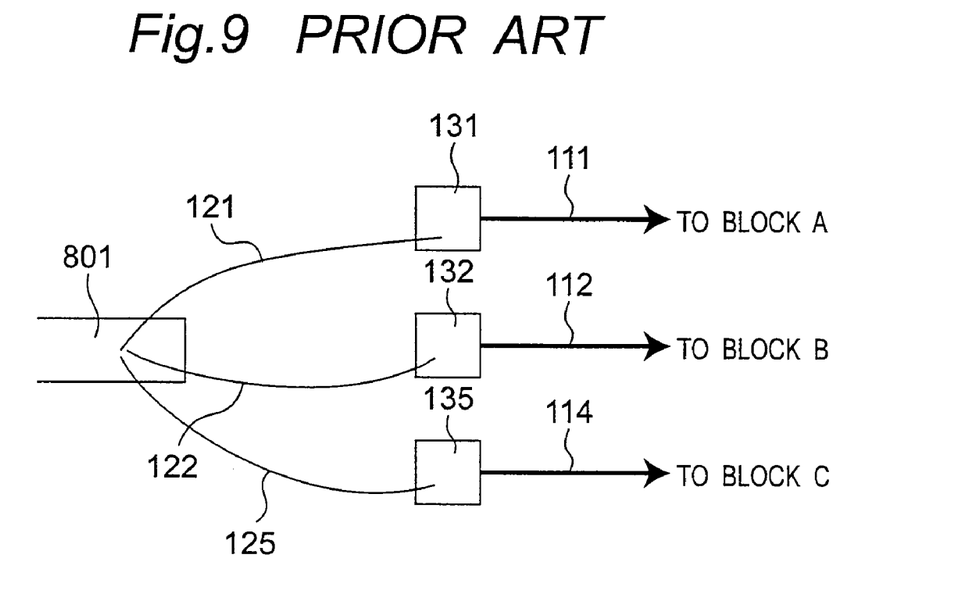
FIG. 9 is an explanatory diagram of another conventional technique of reducing noise interference, in the Publication 1.

As shown in FIG. 9, a wire to be connected to a lead frame 801 is divided into three wires 121, 122, 125 which are connected, respectively, to three pads 131, 132, 135, and isolated from each other. The pads 131, 132, 135 are not connected to each other in a wiring layer on a semiconductor substrate but through the wires. Specifically, a position for connecting the wires at a single point is set on the lead frame 801. Thus, as compared with the technique illustrated in FIG. 8, an impedance value at the single connection point can be lowered to more effectively reduce the noise interference.

In the conventional technique illustrated in FIG. 9, each functional terminal, such as a source terminal or a ground terminal, is provided in a number of only one, and there is no specific problem as long as a current supplied from the terminal falls within an allowable range. However, if the current supplied from the terminal is increased beyond the allowable range, or a plurality of terminals are provided for the purpose of noise reduction, the following problem will occur. If the technique illustrated in FIG. 9 is used for reducing noise interference under the above conditions, electrostatic breakdown level will be undesirably lowered due to the wires which are not connected together in a wiring layer, although noise interference can be reduced.

SUMMARY OF THE INVENTION

In view of the above conventional problem, it is an object of the present invention to provide a semiconductor IC device capable of balancing the protection against noise interference with the protection against electrostatic breakdown.

In order to achieve this object, the present invention provides a semiconductor integrated circuit device which includes a plurality of terminals having a same function. The terminals consist of a plurality of source terminals or ground terminals. The semiconductor integrated circuit device comprises: a plurality of lead frames having the terminals, respectively; a plurality of wire groups each consisting of two or more wires, wherein the wire groups are connected to each other at a single point on the respective lead frames; and a plurality of pad groups each consisting of two or more pads, wherein the pad groups are associated, respectively, with the terminals, and at least one of the pads making up of one of the pad groups is connected to the remaining pad groups, to define an inter-pad connection line. While each of the pad groups is separated from an associated one of the lead frames before a wire bonding process, it is connected to the associated lead frame using one of the wire groups which is connected to the associated lead frame, with relatively low impedance, through the wire bonding process. Although impedance in source and ground lines relative to functional blocks is not changed, the single point connection with the relatively low impedance makes it possible to suppress noise interference. After the wire bonding process, the terminals are connected to each other through an intra-chip wiring layer and the wires to prevent electrostatic breakdown between the terminals.

In contrast to the conventional device having the problem about lowering an electrostatic breakdown level in conjunction with suppressing noise interference, the semiconductor IC device of the present invention makes it possible to balance the protection against noise interference with the protection against electrostatic breakdown.

As above, the semiconductor IC device of the present invention can suppress noise interference while protecting against electrostatic breakdown, in a smaller surface area.

BRIEF DESCRIPTION OF THE DRAWINGS

Various characteristics and advantages of the present invention will become clear from the following description taken in conjunction with the preferred embodiments with reference to the accompanying drawings throughout which like parts are designated by like reference numerals, in which.

DETAILED DESCRIPTION OF THE PREFERRED EMBODIMENTS

With reference to the drawings, various embodiments of the present invention will now be described.

First Embodiment

Figure 1:
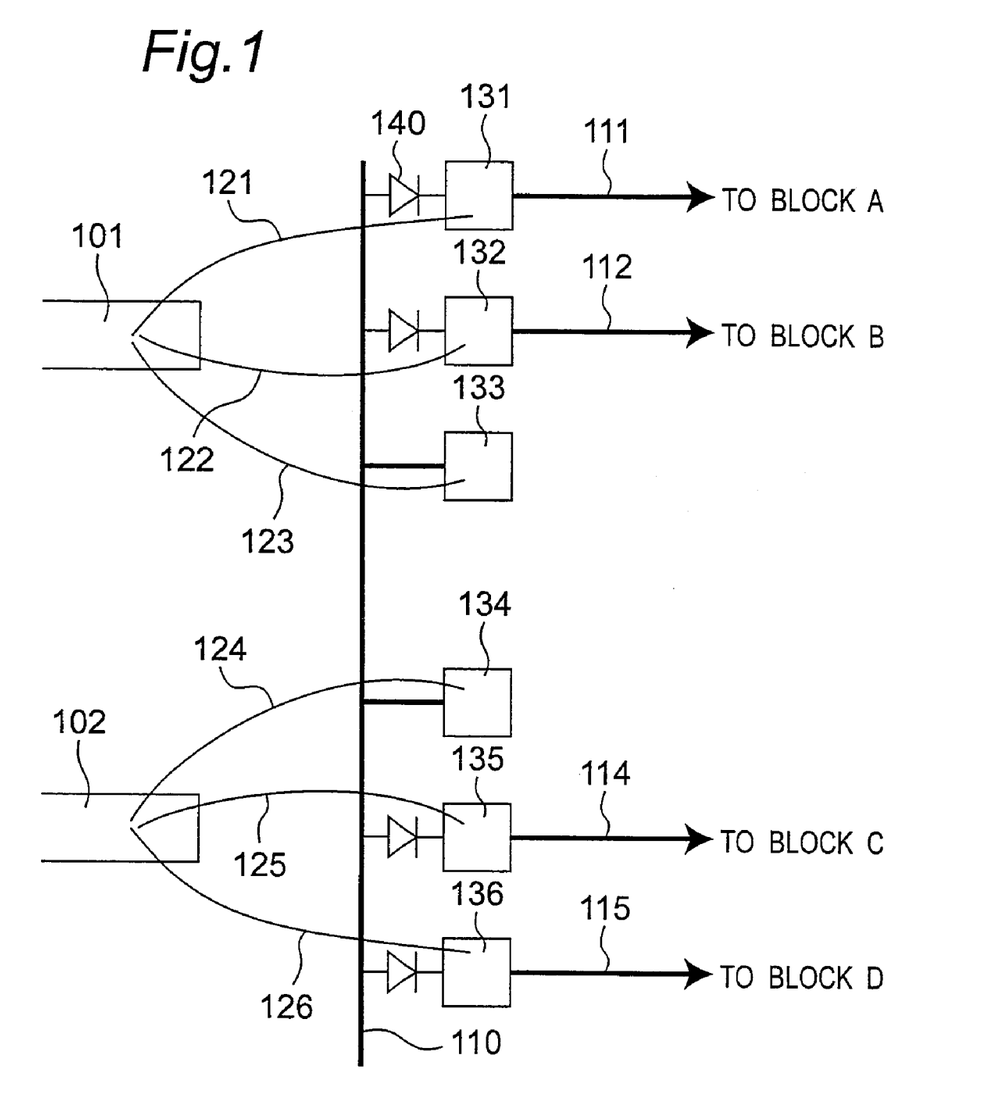
FIG. 1 is a block diagram of a semiconductor IC device according to a first embodiment of the present invention.
Figure 2:
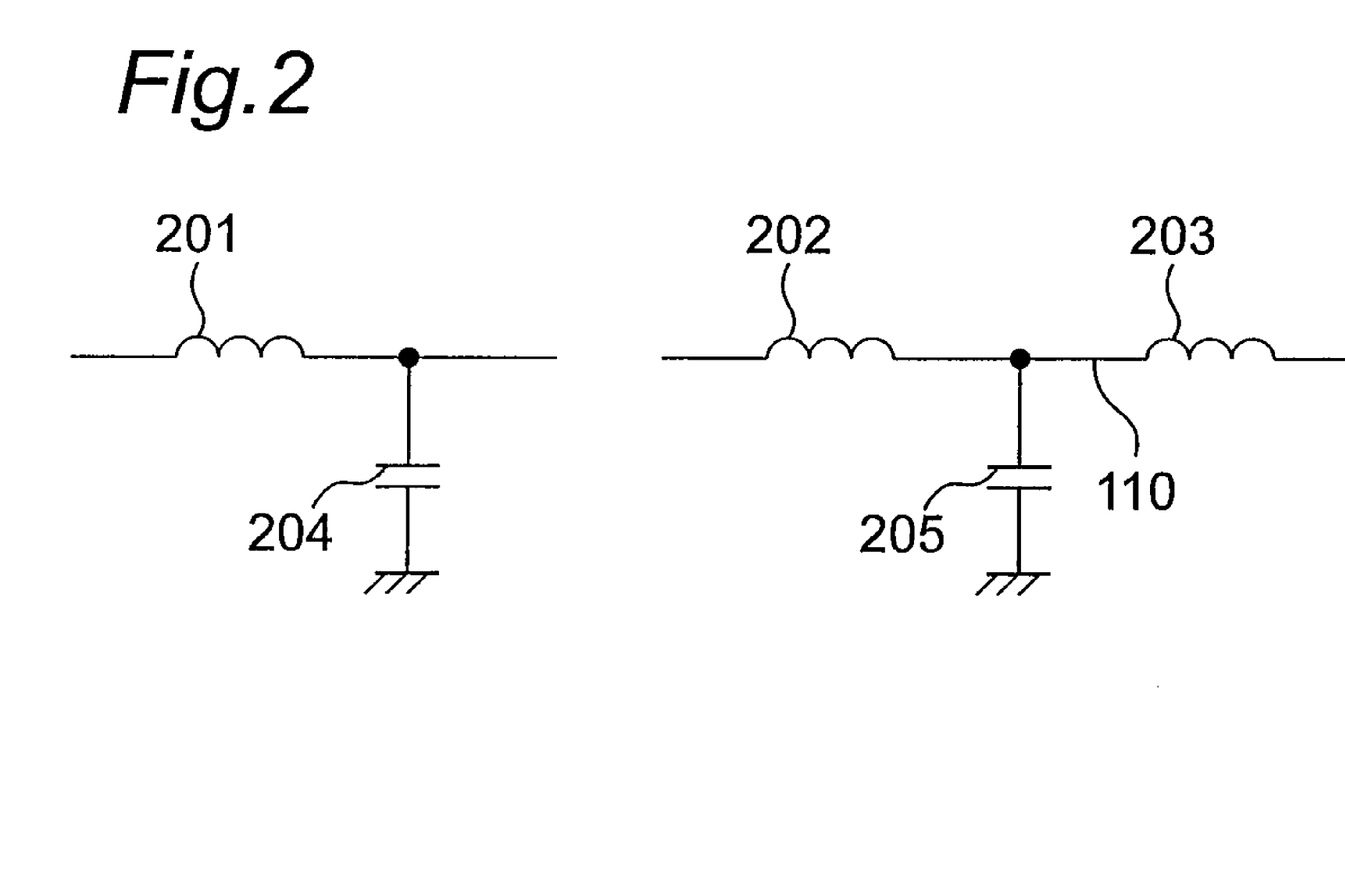
FIG. 2 is an explanatory diagram of a parasitic element in the semiconductor IC device according to the first embodiment.

With reference to FIGS. 1 and 2, a first embodiment of the present invention will be described below. As shown in FIG. 1, a semiconductor IC device according to the first embodiment comprises a first lead frame 101, and two block-dedicated pads 131, 132 which are associated, respectively, with a block A and a block B, and provided for connection between the first lead frame 101 and each of the blocks A, B. The block-dedicated pad 131 is connected to an intra-chip wire 111 connected to the block A, and further connected to a block-dedicated wire 121 for the block A, and an inter-lead-frame connection line 110 for interconnecting between the first lead frame 101 and other lead frame, such as an after-mentioned second lead frame 102. The block-dedicated pad 132 is connected to an intra-chip wire 112 connected to the block B, and further connected to a block-dedicated wire 122 for the block B, and the inter-lead-frame connection line 110. The semiconductor IC device further includes two electrostatic-breakdown protection diodes 140 associated, respectively, with the block A and the block B, a connection pad 133, and a connection wire 123 connected to connection pad 133. The block-dedicated wire, 121, the block-dedicated wire 122 and the connection wire 123 are wire-boded onto the first lead frame 101 in such a manner as to be connected to each other at a single point on the first lead frame 101.

Furthermore, the semiconductor IC device includes a second lead frame 102, and two block-dedicated pads 135, 136 which are associated, respectively, with a block C and a block D, and provided for connection between the second lead frame 102 and each of the blocks C, D. The block-dedicated pad 135 is connected to an intra-chip wire 114 connected to the block C, and further connected to a block-dedicated wire 125 for the block C, and the inter-lead-frame connection line 110. The block-dedicated pad 136 is connected to an intra-chip wire 115 connected to the block D, and further connected to a block-dedicated wire 126 for the block D, and the inter-lead-frame connection line 110. The semiconductor IC device includes two electrostatic-breakdown protection diodes 140 associated, respectively, with the block C and the block D, a connection pad 134, and a connection wire 124 connected to the connection pad 134. The block-dedicated wire 125, the block-dedicated wire 126 and the connection wire 124 are wire-boded onto the second lead frame 102 in such a manner as to be connected to each other at a single point on the second lead frame 102.

Figure 7:
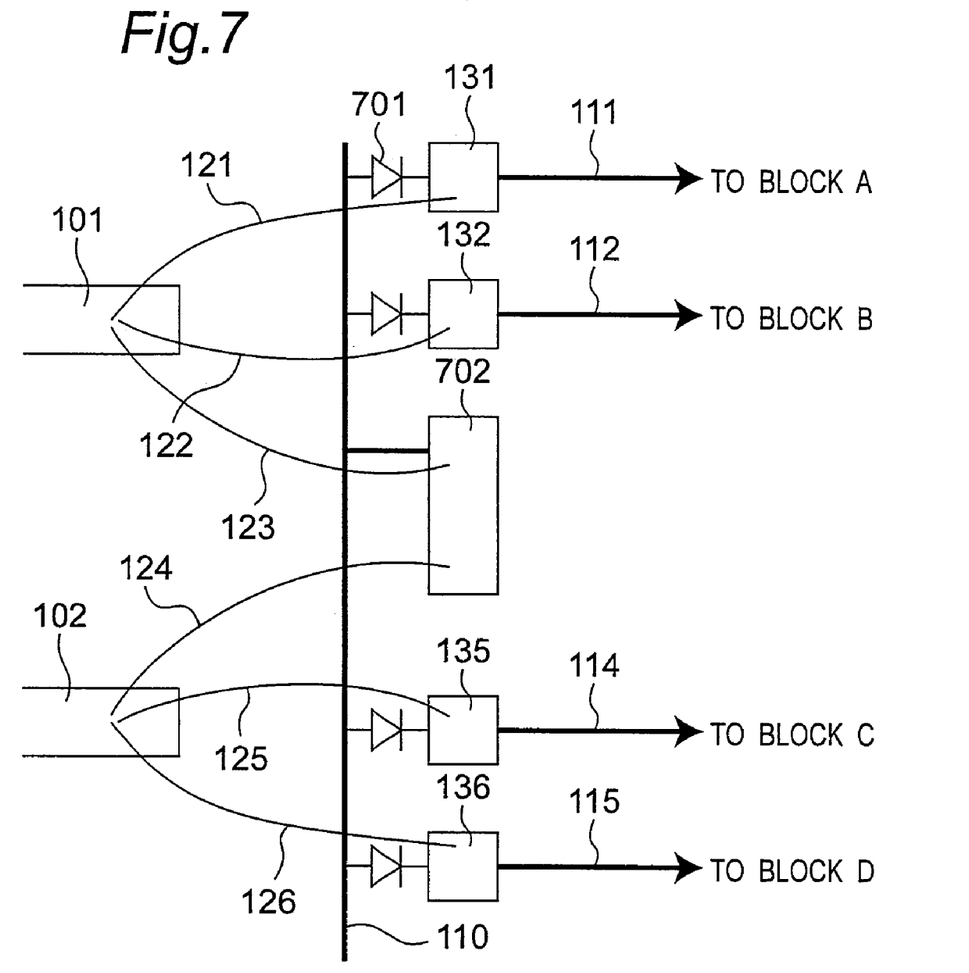
FIG. 7 is a block diagram of the semiconductor IC device according to the third embodiment.

In the semiconductor IC device illustrated in FIG. 1, the first lead frame 101 and each of the blocks A, B are not wired or electrically connected to each other by a wiring layer on a semiconductor substrate but through the use of the block-dedicated wires 121, 122 connected to the block-dedicated pads 131, 132. In the same manner, the second lead frame 102 and each of the blocks C, D are not wired or electrically connected to each other by the wiring layer but through the use of the block-dedicated wires 125, 126 connected to the block-dedicated pads 135, 136. In the first embodiment, instead of the two connection pads 133, 134, a single pad 702 may be provided as shown in FIG. 7.

When the number of blocks connected to one lead frame is "n", the number of pads is preferably "n+1". However, if the number of blocks as a noise source is "m", at least (m+1) isolated pads may be connected to one lead frame to efficiently isolate respective noises.

The one pad ("+1") in the (n+1) pads is exclusively used as the connection pad (133 or 134) wired to the block-dedicated pads (131, 132; or 135, 136) of the first or second lead frame (101 or 102) for the purpose of protection against electrostatic breakdown. The inter-lead-frame connection line 110 which connects between a first group of the block-dedicated pads 131, 132 and the connection pad 133 associated with the first lead frame 101 and a second group of the block-dedicated pads 135, 136 and the connection pad 134 associated with the second lead frame 102 makes it possible to reliably ensure a noise reduction effect. If only (m+1) pads are minimally provided, and there is at least one block which is a non-noise source, a wire of the non-noise-source block can be used to serve as the inter-lead-frame connection line 110. That is, in this case, if there are "m" noise-source blocks, a wire of one non-noise-source block can be used to serve as the inter-lead-frame connection line 110 so as to achieve the same function as that of the first embodiment only by (m+1) pads. Generally, when the semiconductor substrate is a p-type, and the lead frame has a ground terminal, a wire on the p-type substrate is preferably used to serve as the inter-lead-frame connection line 110. Alternatively, the pad 702 as illustrated in FIG. 7 may be used without using the inter-lead-frame connection line 110.

In the first embodiment, the block-dedicated pads 131, 132 are connected onto the first lead frame 101 at a single point through the block-dedicated wires 121, 122, and the block-dedicated pads 135, 136 are connected onto the second lead frame 102 at a single point through the block-dedicated wires 125, 126, as described above. Thus, as shown the left side of FIG. 2, a parasitic inductance 201 is generated in each of the block-dedicated wires. Therefore, as shown in a capacitance 204 may be connected to each of the block-dedicated wires which is intended to be protected against noise interference, to form an LC low-pass filter so as to facilitate noise reduction. Alternatively, a capacitance 204 may be connected between two of the block-dedicated wires from the block-dedicated pads as a noise source, to form a #-type low-pass filter so as to obtain enhanced noise reduction effect as compared with the LC low-pass filter.

Further, as shown the right side of FIG. 2, a capacitance 205 may be connected to the inter-lead-frame connection line 110 for electrostatic breakdown protection, to form a T-type low-pass filter in combination with respective parasitic inductances of the connection wires 123, 124 so as to more effectively prevent noise interference between the first and second lead frames.

Second Embodiment

Figure 3:
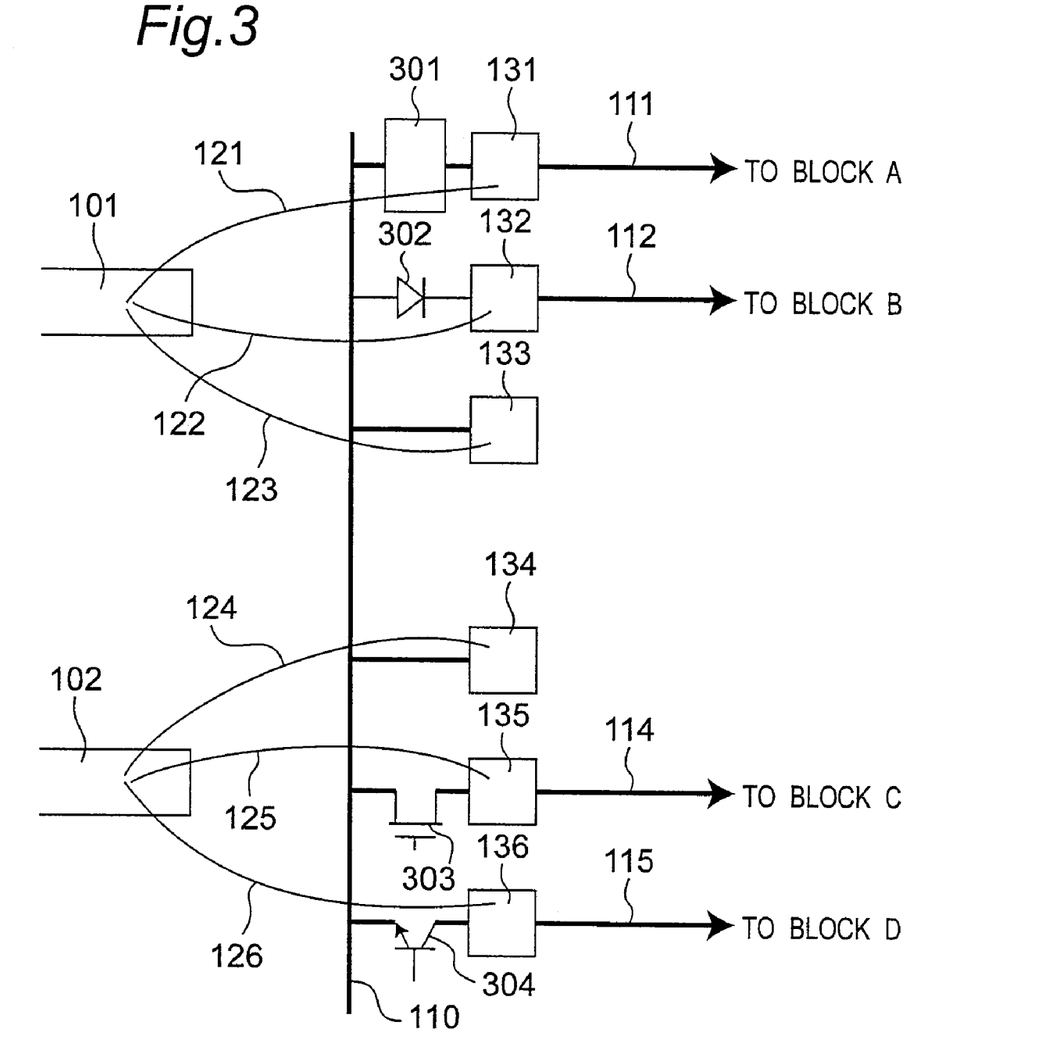
FIG. 3 is a block diagram of a semiconductor IC device according to a second embodiment of the present invention.

With reference to FIG. 3, a second embodiment of the present invention will be described below. In FIG. 3, the same component or element as that in the first embodiment illustrated in FIG. 1 is defined by the same reference numeral or code, and its detailed description will be omitted. In the semiconductor IC device according to the first embodiment which is designed to connect the block-dedicated and connection wires to each other at a single point on the lead frame (101, 102) by a wire bonding process so as to reduce noise interference, the wire connections and the inter-lead-frame connection line 110 are effective in preventing electrostatic breakdown after the wire bonding process. However, the semiconductor IC device according to the first embodiment cannot prevent electrostatic breakdown during and before the wire bonding process.

Figure 4:
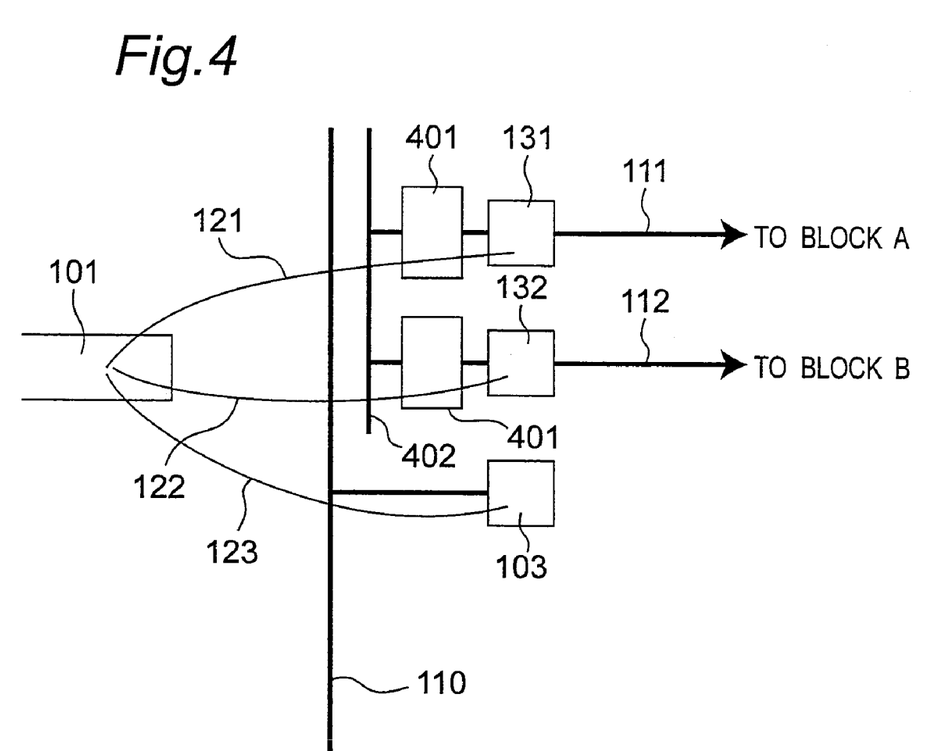
FIG. 4 is a fragmentary block diagram showing one example of modification of the semiconductor IC device according to the second embodiment.

In a semiconductor IC device according to the second embodiment, as shown in FIG. 3, an electrostatic-breakdown protection element 301 is connected to a block-dedicated pad 131 to prevent electrostatic breakdown during and before the wire bonding process. Further, as an electrostatic-breakdown protection element, an electrostatic-breakdown protection diode 302 is connected to a block-dedicated pad 132, and an electrostatic-breakdown protection transistor 303 and an electrostatic-breakdown protection transistor 304 are connected, respectively, to a block-dedicated pad 135 and a block-dedicated pad 136. Each of the electrostatic-breakdown protection elements is provided as a means for protection against electrostatic breakdown during and before the wire bonding process although they have no electrostatic-breakdown protection effect after the wire bonding process because the block-dedicated and connection pads (131, 132, 133; 134, 135, 136) are connected to each other by the block-dedicated and connection wires (121, 122, 123; 124, 125, 126), and equalized in potential. Alternatively, as shown in FIG. 4, an electrostatic-breakdown protection element 401 may be connected to each of the block-dedicated pads, and an electrostatic-breakdown protection line 402 may be provided, so as to maintain the electrostatic-breakdown protection effect even after the wire bonding process.

Third Embodiment

Figure 5:
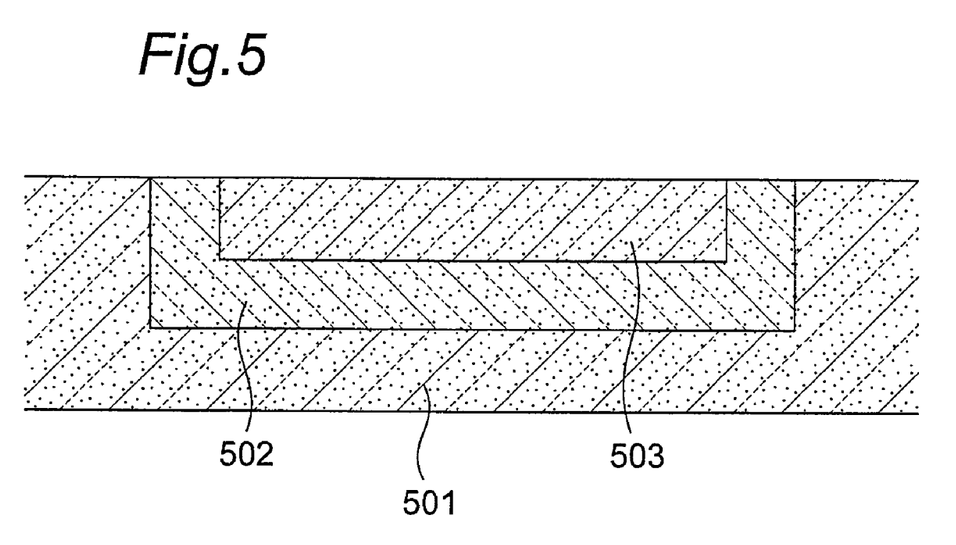
FIG. 5 is a schematic diagram showing the configuration of a semiconductor substrate of a semiconductor IC device according to a third embodiment of the present invention.
Figure 6:
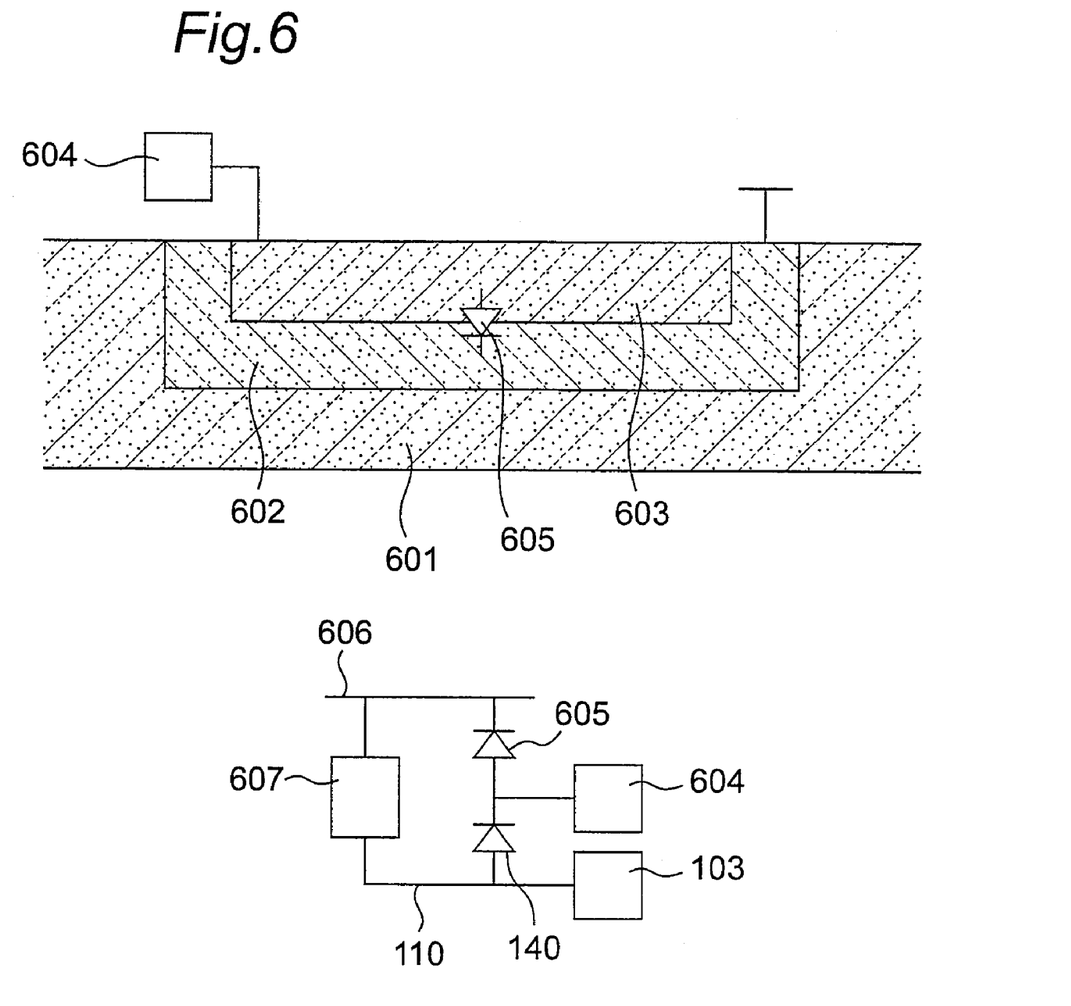
FIG. 6 is an explanatory diagram of a scheme of electrostatic breakdown protection in the semiconductor IC device according to the third embodiment.

With reference to FIGS. 5 to 7, a third embodiment of the present invention will be described below. In FIGS. 6 and 7, the same component or element as that in the first embodiment illustrated in FIG. 1 is defined by the same reference numeral or code, and its detailed description will be omitted. As compared with the first and second embodiments, a semiconductor IC device according to the third embodiment is deigned to more efficiently protect against electrostatic breakdown in more small surface area.

Specifically, as shown in FIG. 5, in the semiconductor IC device according to the third embodiment, a semiconductor substrate having a first conductivity type has a first well having a second conductivity type which is opposite to the first conductivity type, and a second well having the first conductivity type exists in the first well. Further, an electrostatic-breakdown protection element is connected between a source line and a ground line. The ground line is divided in the same manner as that in the first embodiment illustrated in FIG. 1 to prevent noise interference. In this configuration, given that a lead frame has a ground terminal, and the first conductivity type and the second conductivity type are, respectively, a p-type and an n-type, a circuit is formed by an inter-source electrostatic-breakdown protection element 607 and a parasitic diode 605, as shown in FIG. 6. Then, the electrostatic-protection breakdown diode 140 (see FIG. 1) serving as an electrostatic-breakdown protection element can be simply connected between the inter-lead-frame ground line (i.e., inter-lead-frame connection line 110) and the isolated pad (i.e., pad 604) to obtain the layout as shown in FIG. 1 so as to protect against electrostatic breakdown during and before the wire bonding process.

Given that the lead frame has a ground terminal, and the first conductivity type and the second conductivity type in FIG. 5 are, respectively, an n-type and a p-type, a polarity of each electrostatic-breakdown protection diode to be connected may be set in the same manner as that of the diode 701 illustrated in FIG. 7. In FIG. 6, an n-type first well 602 exists in a p-type semiconductor substrate 601, and a p-type second well 603 exists in the first well 602. The second well 603 is connected to the pad 604.

Given that the lead frame has a source terminal, and the first conductivity type and the second conductivity type in FIG. 5 are, respectively, a p-type and an n-type, a polarity of each electrostatic-breakdown protection diode to be connected may be set in the same manner as that of the diode 701 as shown in FIG. 7. Otherwise if the first conductivity type and the second conductivity type in FIG. 5 are, respectively, an n-type and a p-type, a polarity of each electrostatic-breakdown protection diode to be connected may be set in the same manner as that of the diode 140 as shown in FIG. 1.

As mentioned above, the semiconductor integrated circuit device is effective in reducing noise interference and preventing electrostatic breakdown, and suitable for use as a semiconductor integrated circuit.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A semiconductor integrated circuit device including a plurality of terminals having a same function, said terminals consisting of a plurality of source terminals or ground terminals, comprising: a plurality of lead frames connected to said terminals, respectively; a plurality of wire groups each consisting of two or more wires, said wire groups being connected to said lead frames, respectively; and a plurality of pad groups each consisting of two or more pads, said pad groups being associated with said terminals, respectively, at least one of said pads making up of one of said pad groups being connected to the remaining pad groups, to define an inter-pad connection line, wherein each of said pad groups is connected to an associated one of said lead frames through one of said wire groups which is connected to said associated lead frame, wherein said inter-pad connection line is used solely for an inter-pad connection and a surge protection line.

2. A semiconductor integrated circuit device including a plurality of terminals having a same function, said terminals consisting of a plurality of source terminals or ground terminals, comprising: a plurality of lead frames connected to said terminals, respectively; a plurality of wire groups each consisting of two or more wires, said wire groups being connected to said lead frames, respectively; and a plurality of pad groups each consisting of two or more pads, said pad groups being associated with said terminals, respectively, at least one of said pads making up of one of said pad groups being connected to the remaining pad groups, to define an inter-pad connection line, wherein each of said pad groups is connected to an associated one of said lead frames through one of said wire groups which is connected to said associated lead frame, wherein said inter-pad connection line is used for a source/ground line having a relatively low noise level, in said semiconductor integrated circuit device.

3. The semiconductor integrated circuit device according to claim 1, which includes an electrostatic-breakdown protection element between each of said pads and said inter-pad connection line.

4. The semiconductor integrated circuit device according to claim 2, which includes an electrostatic-breakdown protection element between each of said pads and said inter-pad connection line.

* * * * *